(12) United States Patent
Hong et al.

(10) Patent No.: US 9,112,062 B2
(45) Date of Patent: Aug. 18, 2015

(54) SEMICONDUCTOR DEVICE AND METHOD OF MANUFACTURING THE SAME

(71) Applicant: Samsung Electronics Co., Ltd., Suwon-Si, Gyeonggi-Do (KR)

(72) Inventors: JiSun Hong, Asan-si (KR); Hyunki Kim, Cheonan-si (KR); JongBo Shim, Asan-si (KR); SeokWon Lee, Seongnam-si (KR); Kyoungsei Choi, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 3 days.

(21) Appl. No.: 13/974,254

(22) Filed: Aug. 23, 2013

(65) Prior Publication Data

US 2014/0117506 A1  May 1, 2014

(30) Foreign Application Priority Data

Oct. 26, 2012  (KR) .................. 10-2012-0119724

(51) Int. Cl.
| | |
|---|---|
| H01L 23/00 | (2006.01) |
| H01L 25/10 | (2006.01) |
| H01L 25/00 | (2006.01) |
| H01L 21/56 | (2006.01) |
| H01L 25/065 | (2006.01) |
| H01L 23/31 | (2006.01) |

(52) U.S. Cl.
CPC .............. H01L 24/97 (2013.01); H01L 21/561 (2013.01); H01L 25/105 (2013.01); H01L 25/50 (2013.01); *H01L 23/3128* (2013.01); *H01L 23/3135* (2013.01); *H01L 24/16* (2013.01); *H01L 24/32* (2013.01); *H01L 24/73* (2013.01); *H01L 25/0657* (2013.01); *H01L 2224/16145* (2013.01); *H01L 2224/16225* (2013.01); *H01L 2224/32145* (2013.01); *H01L 2224/32225* (2013.01); *H01L 2224/73204* (2013.01); *H01L 2224/73207* (2013.01); *H01L 2224/73265* (2013.01); *H01L 2224/97* (2013.01); *H01L 2225/0651* (2013.01); *H01L 2225/06513* (2013.01); *H01L 2225/06541* (2013.01); *H01L 2225/06568* (2013.01); *H01L 2225/1023* (2013.01); *H01L 2225/1058* (2013.01); *H01L 2924/15311* (2013.01); *H01L 2924/15331* (2013.01); *H01L 2924/18161* (2013.01)

(58) Field of Classification Search
CPC ...... H01L 21/77; H01L 23/522; H01L 25/065
USPC .................. 257/659, 686, E25.013, E21.598; 438/109
See application file for complete search history.

(56) References Cited

U.S. PATENT DOCUMENTS

| | | | |
|---|---|---|---|
| 7,256,072 | B2 | 8/2007 | Shiozawa et al. |
| 7,257,072 | B2 | 8/2007 | Kikuchi |

(Continued)

FOREIGN PATENT DOCUMENTS

| | | | |
|---|---|---|---|
| KR | 100839075 B1 | 6/2008 | |
| KR | 101096453 B1 | 12/2011 | |

*Primary Examiner* — Karen Kusumakar
*Assistant Examiner* — Adam S Bowen
(74) *Attorney, Agent, or Firm* — Harness, Dickey & Pierce, P.L.C.

(57) ABSTRACT

A semiconductor device includes a first semiconductor package including a first mold part, a second semiconductor package including a second mold part, a connecting pattern configured to electrically connect the first and second semiconductor packages to each other, and a molding pattern between the first and second semiconductor packages. The molding pattern extends to cover at least a portion of a sidewall of only the second semiconductor package.

20 Claims, 8 Drawing Sheets

(56) References Cited

U.S. PATENT DOCUMENTS

| | | |
|---|---|---|
| 2002/0105091 A1* | 8/2002 | Ishii et al. .................... 257/777 |
| 2006/0125096 A1 | 6/2006 | Shiozawa et al. |
| 2008/0111224 A1 | 5/2008 | Byun et al. |
| 2008/0157327 A1 | 7/2008 | Yang |
| 2010/0314757 A1 | 12/2010 | Sugiyama et al. |
| 2012/0074586 A1 | 3/2012 | Seo et al. |
| 2012/0139090 A1 | 6/2012 | Kim et al. |
| 2012/0211885 A1* | 8/2012 | Choi et al. .................... 257/737 |
| 2012/0228762 A1* | 9/2012 | Fukuda et al. ............... 257/737 |

* cited by examiner

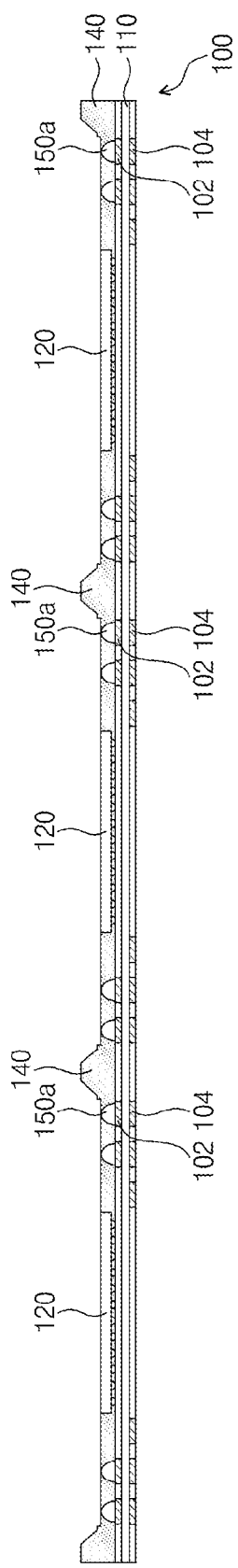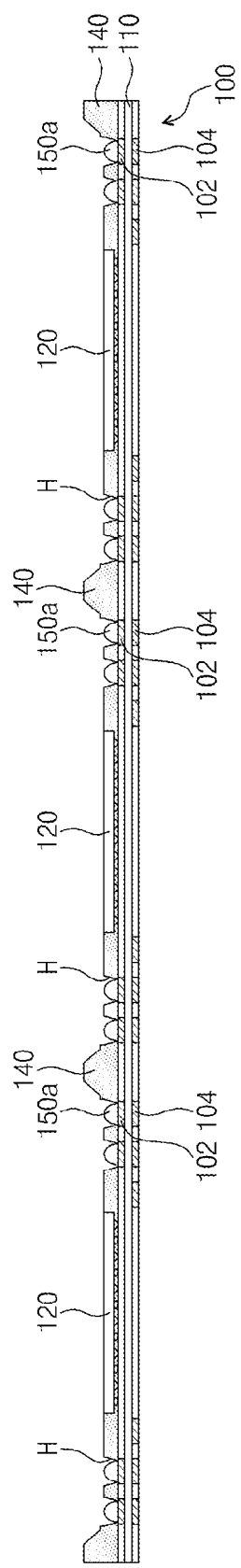

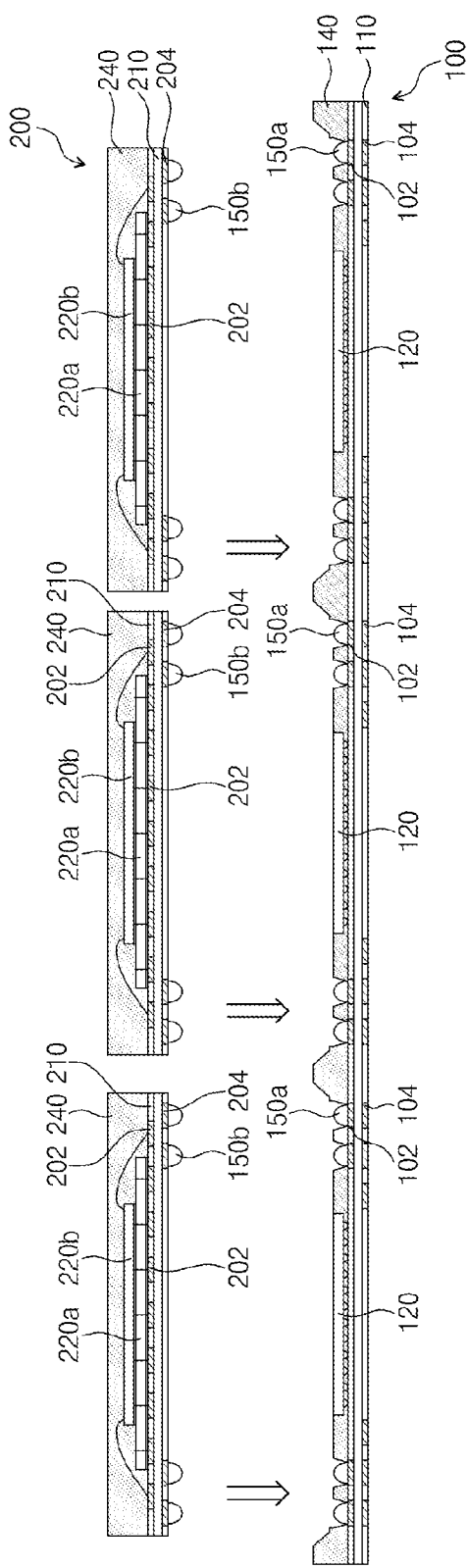
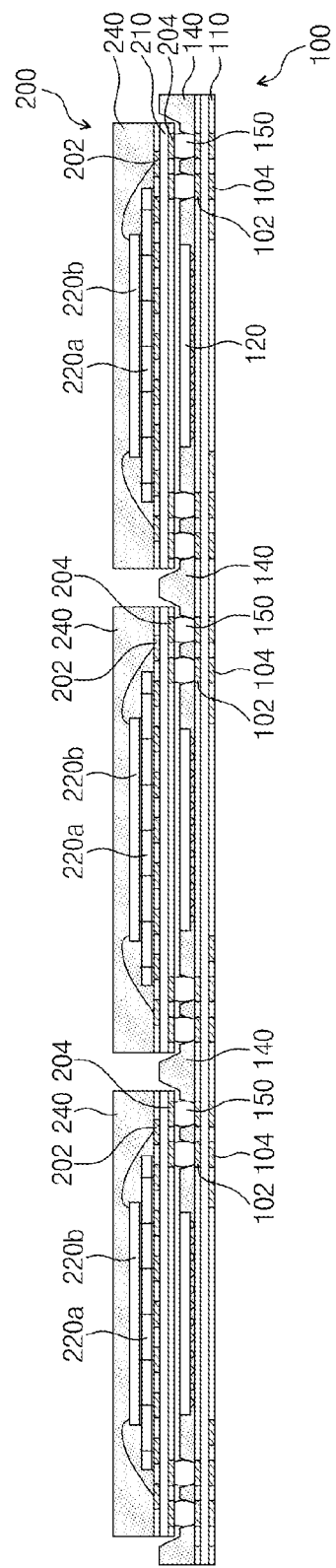
Fig. 2C
Fig. 2D

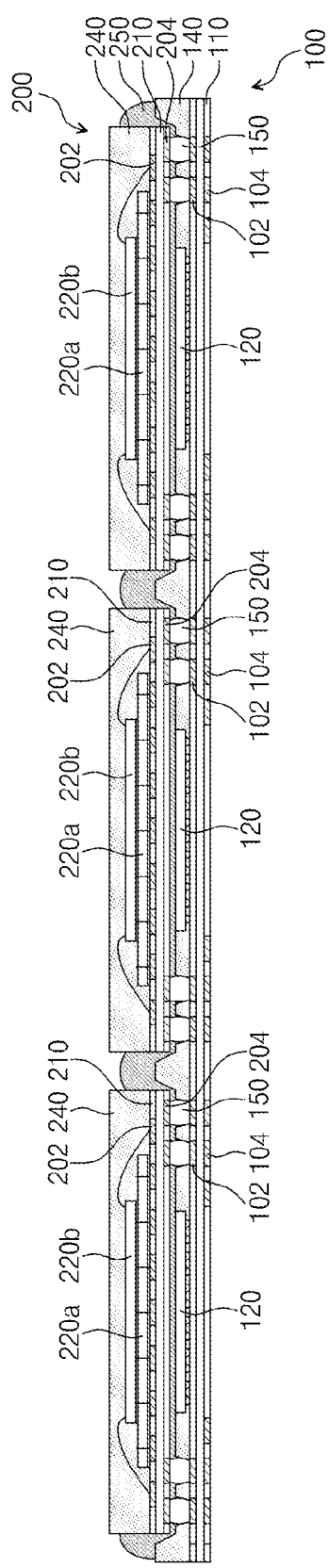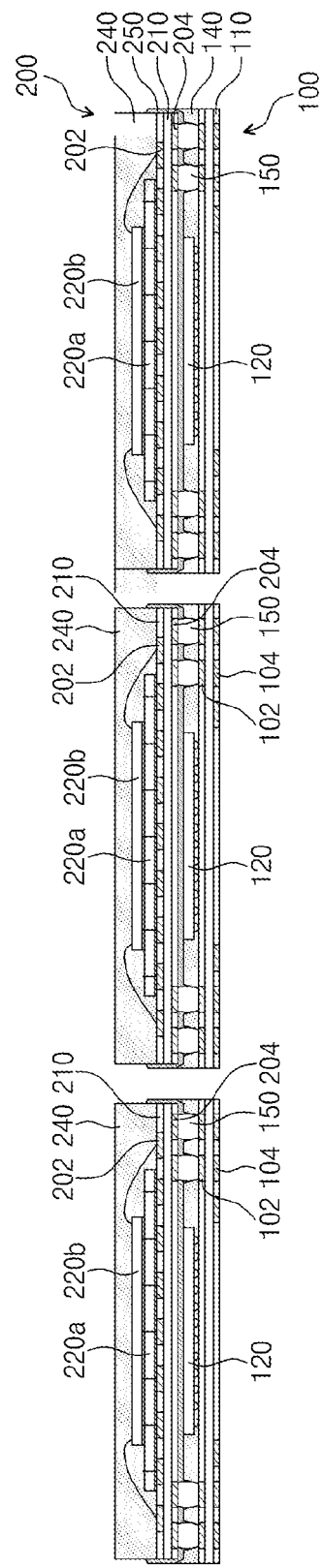

SEMICONDUCTOR DEVICE AND METHOD OF MANUFACTURING THE SAME

CROSS-REFERENCE TO RELATED APPLICATIONS

This U.S. non-provisional patent application claims priority under 35 U.S.C. §119 to Korean Patent Application No. 10-2012-0119724, filed on Oct. 26, 2012, the entirety of which is incorporated by reference herein.

BACKGROUND

1. Field

Example embodiments of the inventive concepts relate to a semiconductor device and a method of manufacturing the same and, more particularly, to a semiconductor device including stacked semiconductor packages and a method of manufacturing the same.

2. Description of the Related Art

Semiconductor devices are widely used in various electronic industries because of their relatively small size, multifunctional capabilities, and/or relatively low manufacture costs. Highly integrated semiconductor devices have been increasingly demanded with the development of the electronic industries. Thus, various problems have been caused in various processes, such that realizing the semiconductor devices may be difficult. Additionally, high speed semiconductor devices have been increasingly demanded with the development of the electronic industries. Research has been conducted for satisfying the demands for the relatively highly integrated and relatively high speed semiconductor devices.

SUMMARY

Example embodiments of the inventive concepts may provide highly integrated semiconductor devices. Example embodiments of the inventive concepts may also provide methods of manufacturing the semiconductor device.

According to example embodiments, a semiconductor device may include a first semiconductor package including a first substrate, a first semiconductor chip mounted on the first substrate, and a first mold part covering at least a portion of the first semiconductor chip, a second semiconductor package on the first semiconductor package and spaced apart from the first semiconductor package, the second semiconductor package including a second substrate, a second semiconductor chip mounted on the second substrate, and a second mold part covering at least a portion of the second semiconductor chip, a connecting pattern configured to electrically connect the first and second semiconductor packages to each other, and a molding pattern covering a space between the first and second semiconductor packages. The molding pattern may extend in a vertical direction to cover at least a portion of a sidewall of only the second semiconductor package.

In example embodiments, an outer sidewall of the molding pattern may be substantially coplanar with the sidewall of the first semiconductor package.

In example embodiments, a width of the first semiconductor package may be greater than a width of the second semiconductor package, and the molding pattern may extend from the first mold part to cover at least a portion of the second substrate.

In example embodiments, the molding pattern may include an underfill material.

In example embodiments, the first mold part may have an exposure mold underfill (e-MUF) structure exposing a top surface of the first semiconductor chip, and the molding pattern may cover the top surface of the first semiconductor chip.

In example embodiments, the first mold part may cover a top surface of the first semiconductor chip.

In example embodiments, one of the first semiconductor chip and the second semiconductor chip may include a through-silicon-via penetrating the one of the first semiconductor chip and the second semiconductor chip.

In example embodiments, the connecting pattern may be in a hole in the first mold part; and the molding pattern may extend to fill the hole including the connecting pattern disposed therein.

According to example embodiments, a method of manufacturing a semiconductor device may include forming a first semiconductor package including mounting a first semiconductor chip on a top surface of a first substrate, forming a first sub-pattern on the top surface of the first substrate, and forming a first mold part to cover the first semiconductor chip and the first sub-pattern, and etching the first mold part to form a hole exposing the first sub-pattern, forming a second semiconductor package including mounting a second semiconductor chip on a top surface of a second substrate, forming a second mold part to cover the second semiconductor chip, and forming a second sub-pattern on a bottom surface of the second substrate, forming a connecting pattern electrically connecting the first and second semiconductor packages to each other by bonding the first sub-pattern of the first semiconductor package and the second sub-pattern of the second semiconductor package, and forming a molding pattern covering a space between the first and second semiconductor packages.

In example embodiments, the molding pattern may be formed to extend from the first mold part to cover at least a portion of a sidewall of the second substrate.

In example embodiments, the first mold part may be etched using a drilling process.

According to example embodiments, a semiconductor device may include at least two stacked semiconductor packages spaced apart from each other, one of the at least two stacked semiconductor packages including a protruding portion extending further in a horizontal direction than the other of the least two stacked semiconductor packages, a connecting pattern configured to electrically connect the at least two stacked semiconductor packages, and a molding pattern covering a space between the at least two stacked semiconductor packages, the molding pattern extending to cover a top surface of the protruding portion of the one of the at least two stacked semiconductor packages and at least a portion of a sidewall of the other of the at least two stacked semiconductor packages.

In example embodiments, the at least two stacked semiconductor packages may include a first semiconductor package including a first substrate, a first semiconductor chip mounted on the first substrate, and a first mold part covering at least a portion of the first semiconductor chip, and a second semiconductor package on the first semiconductor package and spaced apart from the first semiconductor package, the second semiconductor package including a second substrate, a second semiconductor chip mounted on the second substrate, and a second mold part covering at least a portion of the second semiconductor chip.

In example embodiments, a width of the first semiconductor package may be greater than a width of the second semiconductor package, and the molding pattern may extend from the first mold part to cover at least a portion of the second substrate.

In example embodiments, the first mold part may have an exposure mold underfill (e-MUF) structure exposing a top surface of the first semiconductor chip, and the molding pattern may cover the top surface of the first semiconductor chip.

In example embodiments, the first mold part may cover a top surface of the first semiconductor chip.

In example embodiments, one of the first semiconductor chip and the second semiconductor chip may include a through-silicon-via (TSV) penetrating the one of the first semiconductor chip and the second semiconductor chip.

In example embodiments, the connecting pattern may be in a hole in the first mold part, and the molding pattern may extend to fill the hole including the connecting pattern disposed therein.

In example embodiments, an outer sidewall of the molding pattern may be substantially coplanar with the sidewall of the one of the at least two stacked semiconductor packages.

In example embodiments, the molding pattern may include an underfill material.

BRIEF DESCRIPTION OF THE DRAWINGS

The inventive concepts will become more apparent in view of the attached drawings and accompanying detailed description.

FIGS. 2A through 2F are cross-sectional views illustrating a method of manufacturing a semiconductor device according to example embodiments of the inventive concepts;

DETAILED DESCRIPTION

Figure 1A:
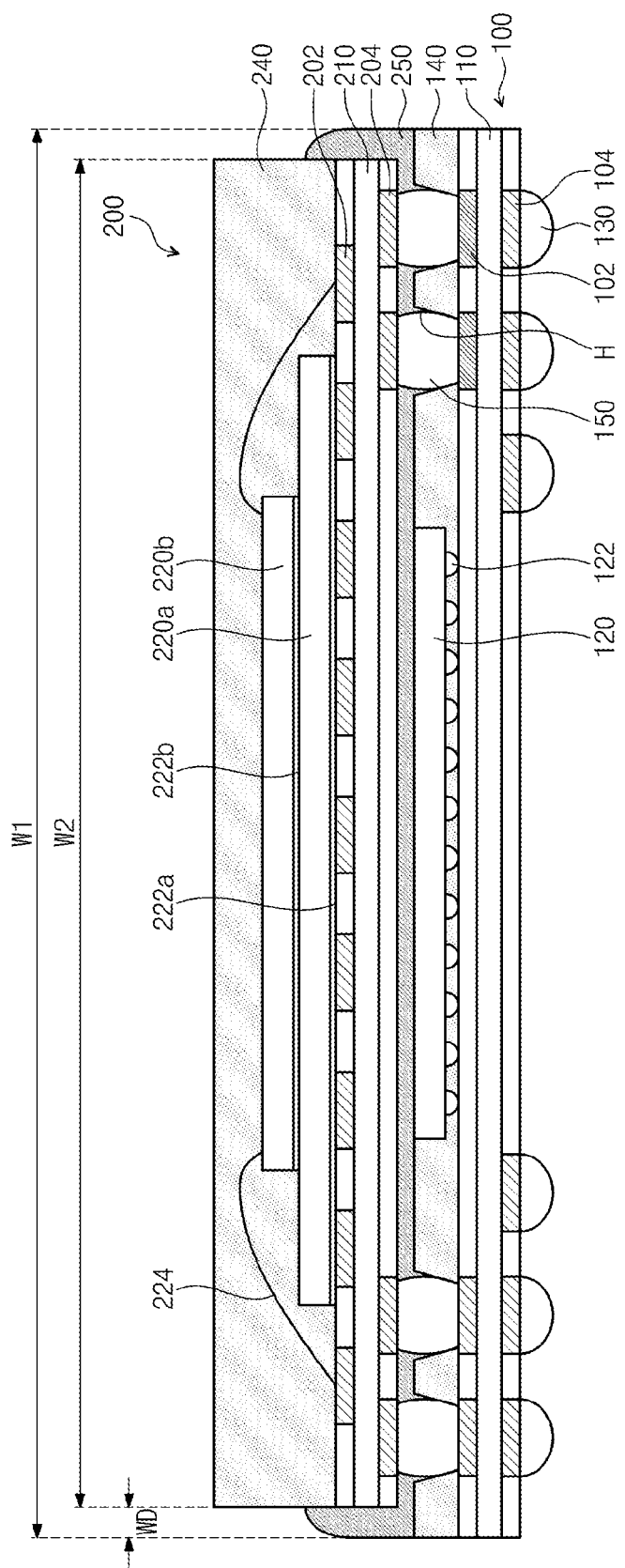
FIG. 1A is a cross-sectional view illustrating a semiconductor device according to example embodiments of the inventive concepts.

The inventive concepts will now be described more fully hereinafter with reference to the accompanying drawings, in which example embodiments of the inventive concepts are shown. The advantages and features of the inventive concepts and methods of achieving them will be apparent from the following example embodiments that will be described in more detail with reference to the accompanying drawings. It should be noted, however, that the inventive concepts are not limited to the following example embodiments, and may be implemented in various forms. Accordingly, example embodiments are provided only to disclose the inventive concepts and let those skilled in the art know the category of the inventive concepts. In the drawings, example embodiments of the inventive concepts are not limited to the specific examples provided herein and are exaggerated for clarity.

The terminology used herein is for the purpose of describing particular embodiments only and is not intended to limit the inventive concepts. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiments in the detailed description will be described with sectional views as example views of the inventive concepts. Accordingly, shapes of the example views may be modified according to manufacturing techniques and/or allowable errors. Therefore, the embodiments of the inventive concepts are not limited to the specific shape illustrated in the example views, but may include other shapes that may be created according to manufacturing processes. Areas exemplified in the drawings have general properties, and are used to illustrate specific shapes of elements. Thus, this should not be construed as limited to the scope of the inventive concepts.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the inventive concepts. Example embodiments of the present inventive concepts explained and illustrated herein include their complementary counterparts. The same reference numerals or the same reference designators denote the same elements throughout the specification.

Moreover, example embodiments are described herein with reference to cross-sectional illustrations and/or plane illustrations that are example illustrations. Accordingly, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

Figure 1B:
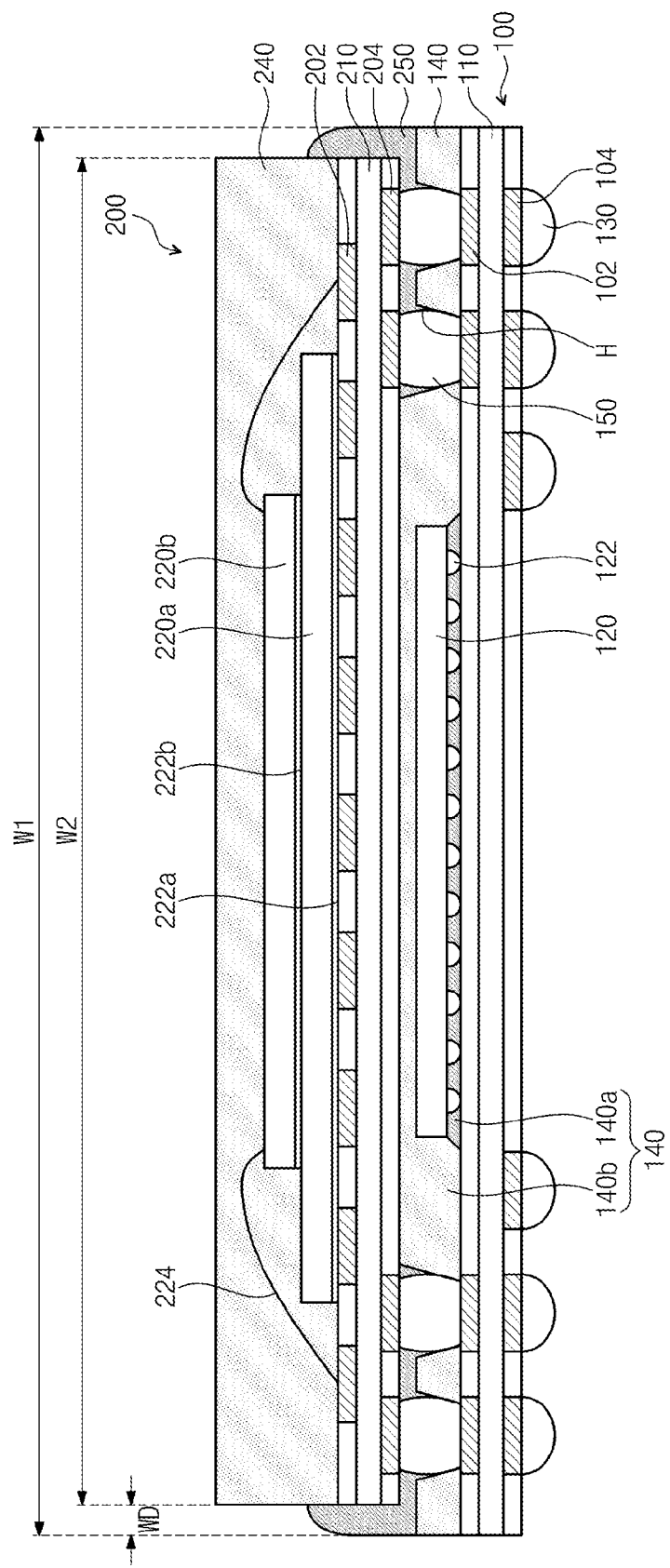
FIG. 1B is a cross-sectional view illustrating a semiconductor device according to example embodiments of the inventive concepts.
Figure 1C:
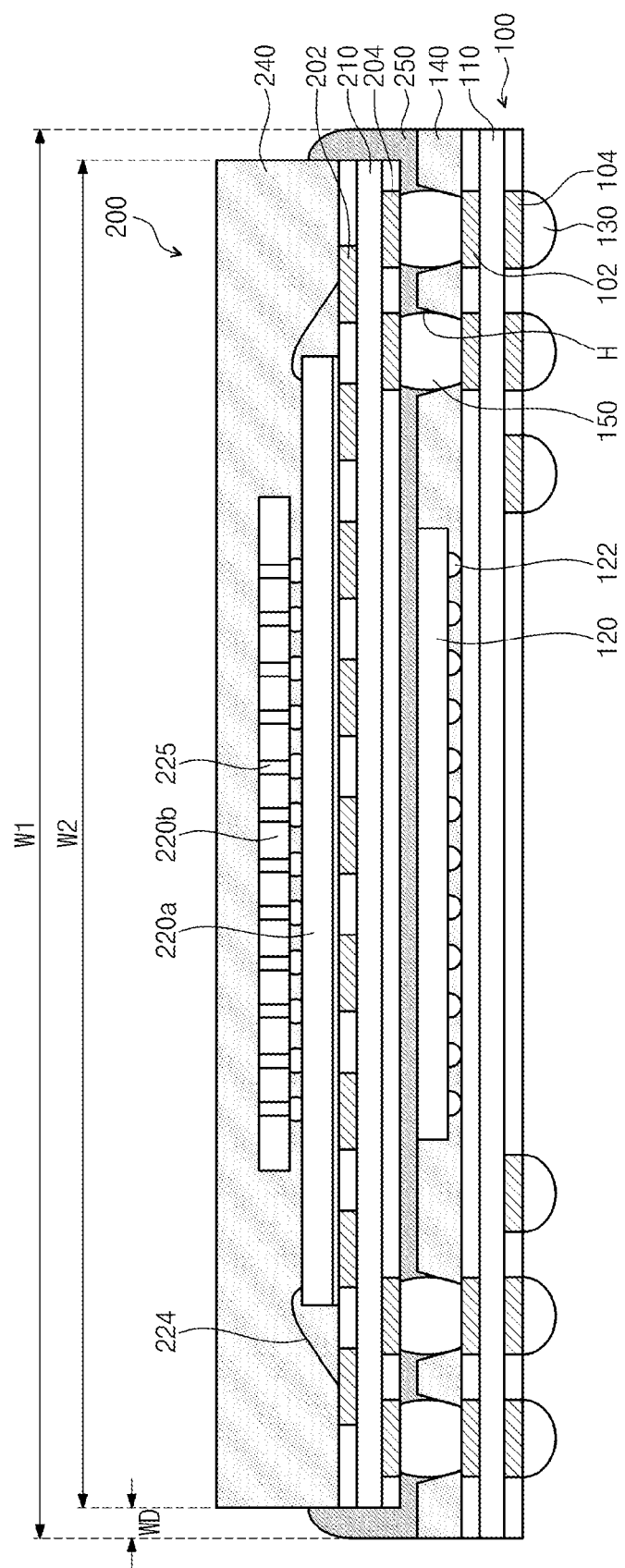
FIG. 1C is a cross-sectional view illustrating a semiconductor device according to example embodiments of the inventive concepts.

FIG. 1A is a cross-sectional view illustrating a semiconductor device according to example embodiments of the inventive concepts, FIG. 1B is a cross-sectional view illustrating a semiconductor device according to example embodiments of the inventive concepts, and FIG. 1C is a cross-sectional view illustrating a semiconductor device according to example embodiments of the inventive concepts.

Referring to FIGS. 1A, 1B, and 1C, a semiconductor device may include a first semiconductor package 100, a second semiconductor package 200, connecting patterns 150, and a molding pattern 250. The second semiconductor package 200 may be disposed on the first semiconductor package 100, and the first and second semiconductor packages 100 and 200 may be electrically connected to each other through the connecting patterns 150.

The first semiconductor package 100 may include a first substrate 110, a first semiconductor chip 120 mounted on the first substrate 110, and a first mold part 140 covering the first semiconductor chip 120.

The first substrate 110 may be a printed circuit board (PCB). The first substrate 110 may include first pads 102 and second pads 104. The first pads 102 may be disposed on a top surface of the first substrate 110, and the second pads 104 may be disposed on a bottom surface of the first substrate 110. The first pads 102 of the first substrate 110 may be electrically connected to the connecting patterns 150, respectively. The second pads 104 of the first substrate 110 may be electrically connected to external terminals 130 (e.g., solder balls), respectively.

The top surface of the first substrate 110 may include a first region on which the first semiconductor chip 120 is disposed, and a second region on which the first pads 102 are disposed. For example, the first region may be a center portion of the top surface of the first substrate 110, and the second region may be an edge portion of the top surface of the first substrate 110.

The first semiconductor chip 120 may be mounted on the first substrate 110. The term "mounted" means that a semiconductor element is bonded to a substrate, a holder, or a frame for actual use. In example embodiments, the first semiconductor chip 120 may be bonded to the first substrate 110 by chip connecting patterns 122. The chip connecting patterns 122 may include solder balls.

The first mold part 140 may be disposed on the first substrate 110 to protect the first semiconductor chip 120, the chip connecting patterns 122, and the connecting patterns 150.

In example embodiments, the first mold part 140 may include holes H exposing the first pads 102, respectively. For example, an upper portion of the hole H may be wider than a lower portion of the hole H. Additionally, the hole H may have an inclined sidewall.

The first mold part 140 according to example embodiments of the inventive concepts may have an exposure mold underfill (e-MUF) structure which exposes a top surface of the first semiconductor chip 120 and covers the first semiconductor chip 120 and the chip connecting patterns 122. The first mold part 140 having the e-MUF structure may be a united structure of an underfill covering chip connecting patterns and a mold covering a semiconductor chip. Thus, the first mold part 140 may include a first portion covering the chip connecting patterns 122 and a second portion covering the first semiconductor chip 120, and the first and second portions of the first mold part 140 may be continuously connected to each other without an interface therebetween. Additionally, an underfill process may be omitted by the first mold part 140 having the e-MUF structure, such that a manufacturing method of the first semiconductor package 100 may be simplified.

The structure of the first mold part 140 may be variously modified. However, the inventive concepts are not limited to the shape of the first mold part 140.

The second semiconductor package 200 may include a second substrate 210, second semiconductor chips 220a and 220b mounted on the second substrate 210, and a second mold part 240 protecting the second semiconductor chips 220a and 220b.

The second substrate 210 may be a semiconductor substrate or a printed circuit board. The second substrate 210 may include first pads 202 and second pads 204. The first pads 202 may be disposed on a top surface of the second substrate 210 and the second pads 204 may be disposed on a bottom surface of the second substrate 210. The first pads 202 may be electrically connected to the second semiconductor chips 220a and 220b. The second pads 204 may be electrically connected to the connecting patterns 150.

The second semiconductor chips 220a and 220b may be mounted on the second substrate 210. In example embodiments, the second semiconductor chips 220a and 220b may be bonded to the second substrate 210 by adhesive films 222a and 222b.

According to example embodiments of the inventive concepts, a plurality of the second semiconductor chips 220a and 220b may be provided in the second semiconductor package 200. The plurality of second semiconductor packages 220a and 220b may be vertically stacked on the second substrate 210. The adhesive films 222a and 222b may be disposed between second substrate 210 and the second semiconductor chip 220a and between the second semiconductor chips 220a and 220b. In FIGS. 1A and 1B, the second semiconductor package 200 includes two second semiconductor chips 220a and 220b. However, the inventive concepts are not limited to the number of the second semiconductor chips 220a and 220b.

At least one of the second semiconductor chips 220a and 220b may be electrically connected to the second substrate 210 through chip connectors (e.g., bonding wires 224).

The second mold part 240 may be disposed on the second substrate 210 to protect the second semiconductor chips 220a and 220b. In example embodiments, the second mold part 240 may have a structure completely covering top surfaces of the second semiconductor chips 220a and 220b. In example embodiments, the second mold part 240 may have an e-MUF structure. However, the inventive concepts are not limited to the aforementioned structures of the second mold part 240.

According to example embodiments of the inventive concepts, a size of the first semiconductor package 100 may be greater than a size of the second semiconductor package 200. For example, a width W1 of the first semiconductor package 100 may be greater than a width W2 of the second semiconductor package 200 in a cross-sectional view. Thus, when the first and second semiconductor packages 100 and 200 are stacked, a sidewall of the first semiconductor package 100 may laterally protrude from a sidewall of the second semiconductor package 200. Accordingly, a horizontal distance WD may be generated between the sidewall of the first semiconductor package 100 and the second semiconductor package 200. Hereinafter, the horizontal distance WD between the sidewalls of the first and second semiconductor packages 100 and 200 is defined as a difference width WD.

The connecting patterns 150 may be disposed between the first and second semiconductor packages 100 and 200. The connecting patterns 150 may electrically connect the first and second semiconductor packages 100 and 200 to each other. In more detail, the connecting pattern 150 may electrically connect the first pad 102 of the first substrate 110 to the second pad 204 of the second substrate 210. The connecting patterns 150 may include solder balls.

According to example embodiments of the inventive concepts, each of the connecting patterns 150 may be disposed in each of the holes H of the first mold part 140. The hole H may be wider than the connecting pattern 150. As illustrated in FIGS. 1A to 1C, the upper portion of the hole H may be wider than the connecting pattern 150. An upper portion of the connecting pattern 150 may be exposed by the first mold part 140. For example, the upper portion of the connecting pattern 150 may protrude to be higher than a top surface of the first mold part 140.

The molding pattern 250 may cover a space between the first and second semiconductor packages 100 and 200. In example embodiments, the molding pattern 250 may be disposed to fill the space between the first and second semiconductor packages 100 and 200. In example embodiments, the molding pattern 250 may include an underfill material.

In example embodiments, the molding pattern 250 may not cover the sidewall of the first semiconductor package 100 but may cover at least a portion of the sidewall of the second semiconductor package 200. An outer sidewall of the molding pattern 250 may be substantially coplanar with the sidewall of the first semiconductor package 100.

The molding pattern 250 may be disposed on the protrusion of the first semiconductor package 100 which laterally protrudes by the difference width WD caused by the difference between the sizes of the first and second semiconductor packages 100 and 200. The molding pattern 250 may cover the top surface of the protrusion of the first semiconductor package 100. The molding pattern 250 may extend from the first mold part 140 to cover at least a portion of a sidewall of the second substrate 210 of the second semiconductor package 200. The molding pattern 250 may cover the remaining portion of the hole H in which the connecting pattern 150 is located and may fill a space between the first mold part 140 and the second substrate 210.

In example embodiments, if the first mold part 140 has the e-MUF structure, the molding pattern 250 may cover the top surface of the first semiconductor chip 120 and may fill a space between the first semiconductor chip 120 and the second substrate 210.

According to the example embodiment illustrated in FIG. 1B, the first mold part 140 may include an underfill 140a covering the chip connecting patterns 122 and a mold 140b covering the first semiconductor chip 120. The mold 140b may completely cover the top surface of the first semiconductor chip 120.

On the other hand, as illustrated in FIG. 1B, if the first mold part 140 is in contact with the second substrate 210, the molding pattern 250 may fill the hole H of the first mold part 140 and may cover the top surface of the protrusion having the difference width WD of the first semiconductor package 100.

Referring to FIG. 1C, the second semiconductor package 200 may include the plurality of second semiconductor chips 220a and 220b. At least one of the second semiconductor chips 220a and 220b may include at least one through-silicon-via (TSV) 225. In example embodiments, the TSV 225 may be disposed in one of the second semiconductor chips 220a and 220b of the second semiconductor package 200. Alternatively, the TSV 225 may be disposed in the first semiconductor package 100. However, the inventive concepts are not limited thereto. The number and/or a position of the TSV 225 may be various modified.

As described above, because the molding pattern 250 may fill the space between the first and second semiconductor packages 110 and 200, stress applied to the connecting patterns 150 may be relaxed or dispersed. Additionally, the molding pattern 250 may be disposed on the portion having the difference width WD (e.g., the protrusion of the first semiconductor package 100) which is caused by the difference between the sizes of the first and second semiconductor packages 100 and 200. Thus, stress applied to the semiconductor device may be relaxed or dispersed to a lower portion of the sidewall of the first semiconductor package 100. As a result, the stress of the semiconductor device may be relaxed or dispersed to increase a lifetime of the semiconductor device.

FIGS. 2A through 2F are cross-sectional views illustrating a method of manufacturing a semiconductor device according to example embodiments of the inventive concepts.

Referring to FIG. 2A, a plurality of first semiconductor chips 120 may be mounted on a first substrate 110 and first sub-patterns 150a may be formed. Subsequently, a first mold part 140 may be formed to cover the first semiconductor chips 120 and the first sub-patterns 150a.

In more detail, first pads 102 may be formed on a top surface of the first substrate 110 and second pads 102 may be formed on a bottom surface of the first substrate 110. The first sub-patterns 150a may be formed on the first pads 102, respectively. For example, each of the first sub-patterns 10a may include a solder ball. In example embodiments, the first mold part 140 may have an e-MUF structure exposing top surfaces of the first semiconductor chips 120. In example embodiments, the first mold part 140 may also cover the top surfaces of the first semiconductor chips 120 as illustrated in FIG. 1B.

The first semiconductor chips 120 may be laterally spaced apart from each other on the first substrate 110. Each of the first semiconductor chip 120, a portion of the first substrate 110 corresponding thereto, and a portion of the first mold part 140 corresponding thereto may constitute a first semiconductor package 100. In other words, a plurality of the first semiconductor packages 100 may be formed on the first substrate 110 of FIG. 2A. The plurality of first semiconductor packages 100 may be arranged horizontally.

Referring to FIG. 2B, the first mold part 140 may be etched to form holes H exposing the first sub-patterns 150a, respectively. In example embodiments, the first mold part 140 may be etched by a drilling process. Due to characteristics of the drilling process, a width of the hole H may become progressively less toward a bottom end of the hole H, and the hole H may have an inclined sidewall.

Referring to FIG. 2C, second semiconductor packages 200 may be bonded to top surfaces of the first semiconductor packages 100, respectively.

In more detail, the second semiconductor package 200 may include a second substrate 210 on which first pads 202 and second pads 204 are formed. The first pad 202 may be formed on a top surface of the second substrate 210, and the second pads 204 may be formed on a bottom surface of the second substrate 210. Second semiconductor chips 220a and 220b may be mounted on the second substrate 210, and a second mold part 240 may be formed on the second substrate 210 to protect the second semiconductor chips 220a and 220b. Second sub-patterns 150b may be formed on the second pads 204. The first and second sub-patterns 150a and 150b may be disposed to correspond to each other.

Although not shown, through-silicon-vias 225 of FIG. 1C may be formed in at least one of the second semiconductor chips 220a and 220b.

Referring to FIG. 2D, after the first and second sub-patterns 150a and 150b may be adhered to each other, heat and a pressure may be applied to the first and second sub-patterns 150a and 150b adhered to each other. Thus, the first and second sub-patterns 150a and 150b may be combined with each other to form a connecting pattern 150. A plurality of the connecting patterns 150 may be formed in a combined structure of the first and second semiconductor packages 100 and 200.

As a result, the first and second semiconductor packages 100 and 200 may be electrically connected to each other through the connecting patterns 150. Additionally, the first and second semiconductor packages 100 and 200 may be spaced apart from each other by the connecting patterns 150.

Referring to FIG. 2E, a molding pattern 250 may be formed between the first and second semiconductor packages 100 and 200.

In example embodiments, a space between the first and second semiconductor packages 100 and 200 may be filled with a fluid molding material. For example, the fluid molding material may include an underfill material. Because the molding material has fluidity, the molding material may fill the remaining portions of holes H in which the connecting patterns 150 are formed and may cover the exposed top surface of the first semiconductor chip 120.

The fluid molding material filling the first and second semiconductor packages 100 and 200 may be hardened by heat or ultraviolet rays to form the molding pattern 250. The first and second semiconductor packages 100 and 200 bonded to each other may constitute a semiconductor device. Thus, the structure illustrated in FIG. 2E may include a plurality of the semiconductor devices connected to each other.

Referring to FIG. 2F, the structure illustrated in FIG. 2E may be cut to form the semiconductor devices spaced apart from each other. Each of the semiconductor devices includes the first and second semiconductor packages 100 and 200 which are bonded to each other and are sequentially stacked.

In more detail, the structure illustrated in FIG. 2E may be cut in such a way that the first substrate 110 of the first semiconductor package 100 is greater in size than the second substrate 210 of the second semiconductor package 200. Thus, the molding pattern 250 may be formed on the portion having the difference width WD of FIG. 1A (e.g., the lateral protrusion of the first semiconductor package 100) caused by difference between sizes of the first and second semiconductor packages 100 and 200.

External terminals 130 of FIG. 1A may be formed on the second pads disposed on the bottom surface of the first substrate 110, respectively. As a result, the semiconductor device including the first and second semiconductor packages 100 and 200 may be completed.

As described above, because the molding pattern 250 may fill the space between the first and second semiconductor packages 110 and 200, stress applied to the connecting patterns 150 may be relaxed or dispersed. Additionally, the molding pattern 250 may be disposed on the portion having the difference width WD (e.g., the protrusion of the first semiconductor package 100) which is generated by the difference between the sizes of the first and second semiconductor packages 100 and 200. Thus, stress applied to the semiconductor device may be relaxed or dispersed to a lower portion of the sidewall of the first semiconductor package 100. As a result, the stress of the semiconductor device may be relaxed or dispersed to increase a lifetime of the semiconductor device.

Figure 3A:
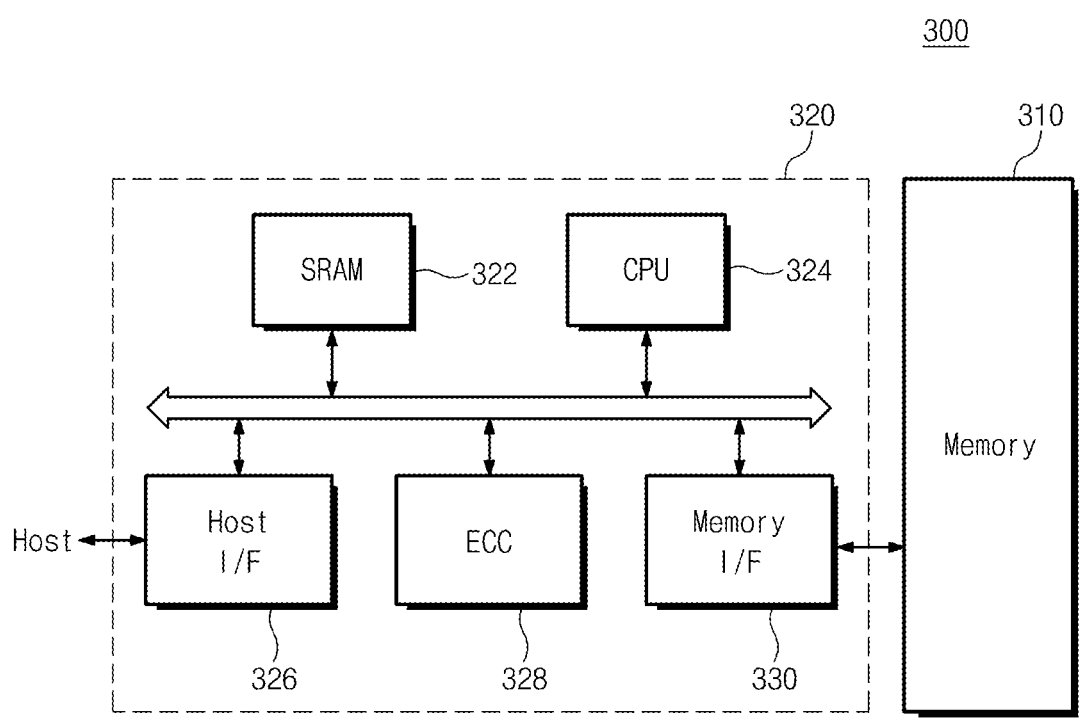
FIG. 3A is a schematic block diagram illustrating a memory card including a semiconductor device according to example embodiments of the inventive concepts.

FIG. 3A is a schematic block diagram illustrating a memory card including a semiconductor device according to example embodiments of the inventive concepts.

Referring to FIG. 3A, the semiconductor device according to example embodiments of the inventive concepts may be applied to a memory card 300. For example, the memory card 300 may include a memory controller 320 that controls data communication between a host and a memory device 310. A static random access memory (SRAM) device 322 may be used as an operation memory of a central processing unit (CPU) 324. A host interface unit 326 may be configured to include a data communication protocol between the memory card 300 and the host. An error check and correction (ECC) block 328 may detect and correct errors of data which are read out from the memory device 310. A memory interface unit 330 may interface with the memory device 310. The CPU 324 controls overall operations of the memory controller 324.

The memory device 310 in the memory card 300 may include the semiconductor device according to example embodiments. of the inventive concepts. Thus, the stress of the semiconductor device may be relaxed or dispersed to increase the lifetime of the semiconductor device and/or the memory card 300.

Figure 3B:
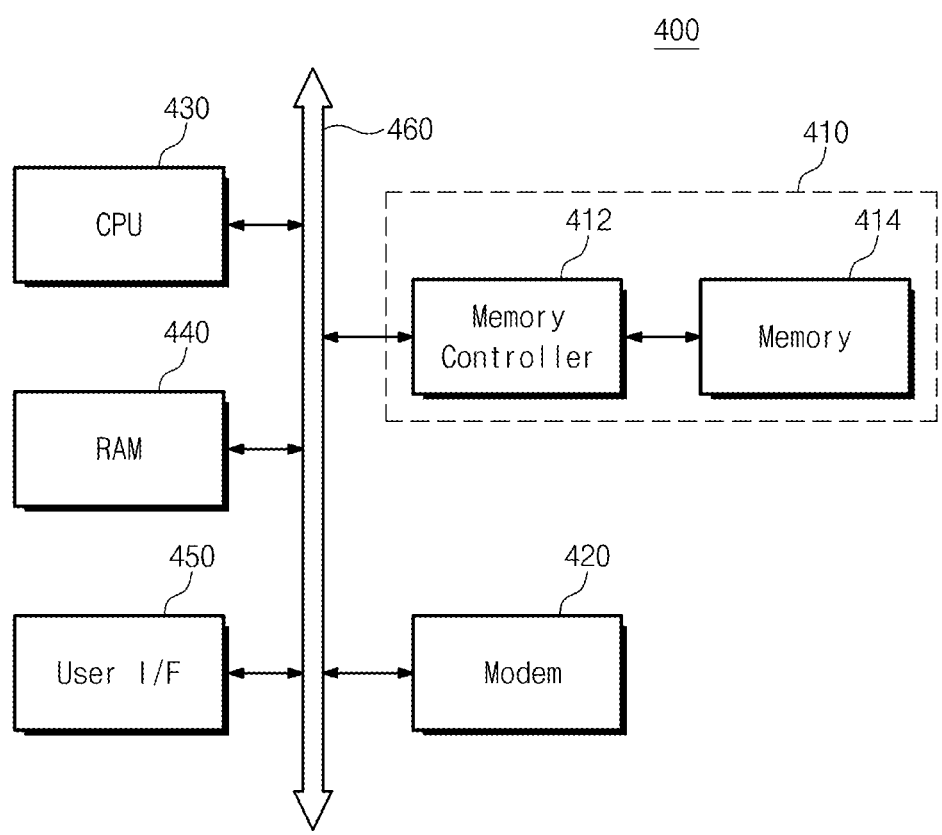
FIG. 3B is a schematic block diagram illustrating a system including a semiconductor device according to example embodiments of the inventive concepts.

FIG. 3B is a schematic block diagram illustrating a system including a semiconductor device according to example embodiments of the inventive concepts.

Referring to FIG. 3B, an information processing system 400 may include the semiconductor device according to example embodiments. of the inventive concepts. The information processing system 400 may include a mobile device or a computer. For example, the information processing system 400 may include a modem 420, a central processing unit (CPU) 430, a random access memory (RAM) 440, and a user interface unit 450 that are electrically connected to a memory system 410 through a system bus 460. The memory system 410 may store data processed by the central processing unit 430 or data inputted from an external system. The memory system 410 may include a memory device 412 and a memory controller 414. The memory system 410 may have substantially the same structure as the memory card 300 described with reference to FIG. 3A. The information processing system 400 may be realized as a memory card, a solid state disk (SSD) device, a camera image sensor and/or another type of application chipset. For example, the memory system 410 may consist of the SSD device. In this case, the information processing system 400 may stably and reliably store massive data.

According to example embodiments of the inventive concepts, the molding pattern may fill the space between the first and second semiconductor packages, such that the stress applied to the connecting pattern between the first and second semiconductor packages may be relaxed or dispersed. Thus, the lifetime of the semiconductor device including the first and second semiconductor packages may increase.

While the inventive concepts have been described with reference to example embodiments, it will be apparent to those skilled in the art that various changes and modifications may be made without departing from the spirit and scope of the inventive concepts. Therefore, it should be understood that the above embodiments are not limiting, but illustrative. Thus, the scope of the inventive concepts is to be determined by the broadest permissible interpretation of the following claims and their equivalents, and shall not be restricted or limited by the foregoing description.

What is claimed is:

1. A semiconductor device comprising:
   a first semiconductor package including,
     a first substrate,
     a first semiconductor chip mounted on the first substrate, and
     a first mold part covering at least a portion of the first semiconductor chip;
   a second semiconductor package on the first semiconductor package and spaced apart from the first semiconductor package, the second semiconductor package including,
     a second substrate,
     a second semiconductor chip mounted on the second substrate, and
     a second mold part covering at least a portion of the second semiconductor chip;

a connecting pattern configured to electrically connect the first and second semiconductor packages to each other; and a molding pattern covering a space between the first and second semiconductor packages, the molding pattern extending in a vertical direction to cover at least a portion of a sidewall of only the second semiconductor package.

2. The semiconductor device of claim 1, wherein an outer sidewall of the molding pattern is substantially coplanar with the sidewall of the first semiconductor package.

3. The semiconductor device of claim 1, wherein:
a width of the first semiconductor package is greater than a width of the second semiconductor package, and
the molding pattern extends from the first mold part to cover at least a portion of the second substrate.

4. The semiconductor device of claim 1, wherein the molding pattern includes an underfill material.

5. The semiconductor device of claim 1, wherein:
the first mold part has an exposure mold underfill (e-MUF) structure exposing a top surface of the first semiconductor chip, and
the molding pattern covers the top surface of the first semiconductor chip.

6. The semiconductor device of claim 1, wherein the first mold part covers a top surface of the first semiconductor chip.

7. The semiconductor device of claim 1, wherein one of the first semiconductor chip and the second semiconductor chip includes a through-silicon-via (TSV) penetrating the one of the first semiconductor chip and the second semiconductor chip.

8. The semiconductor device of claim 1, wherein:
the connecting pattern is in a hole in the first mold part, and
the molding pattern extends to fill the hole including the connecting pattern disposed therein.

9. The semiconductor device of claim 1, wherein
the molding pattern covers a top surface of the first mold part and a top surface of the first semiconductor chip, and
the connecting pattern extends through the first mold part and the molding pattern to electrically connect the first and second semiconductor packages to each other.

10. A semiconductor device comprising:
at least two stacked semiconductor packages spaced apart from each other, one of the at least two stacked semiconductor packages including a protruding portion extending further in a horizontal direction than the other of the least two stacked semiconductor packages;
a connecting pattern configured to electrically connect the at least two stacked semiconductor packages; and
a molding pattern covering a space between the at least two stacked semiconductor packages, the molding pattern extending to cover a top surface of the protruding portion of the one of the at least two stacked semiconductor packages and at least a portion of a sidewall of the other of the at least two stacked semiconductor packages.

11. The semiconductor device of claim 10, wherein
the molding pattern covers a top surface of the first mold part and a top surface of the first semiconductor chip,
the one of the at least two stacked semiconductor packages is the first semiconductor package,
the other of the at least two stacked semiconductor packages is the second semiconductor package, and
the connecting pattern extends through the first mold part and the molding pattern to electrically connect the first and second semiconductor packages to each other.

12. A semiconductor device comprising:
at least two stacked semiconductor packages spaced apart from each other,
the at least two stacked semiconductor packages including a first semiconductor package and a second semiconductor package,
the second semiconductor package being on the first semiconductor package,
the first semiconductor package including a first mold part covering at least a portion of the first semiconductor chip,
the second semiconductor package including a second mold part covering at least a portion of a second semiconductor chip,
one of the at least two stacked semiconductor packages including a protruding portion extending further in a horizontal direction than the other of the least two stacked semiconductor packages;
a connecting pattern configured to electrically connect the at least two stacked semiconductor packages; and
a molding pattern covering a space between the at least two stacked semiconductor packages, the molding pattern extending to cover a top surface of the protruding portion of the one of the at least two stacked semiconductor packages and at least a portion of a sidewall of the other of the at least two stacked semiconductor packages.

13. The semiconductor device of claim 12, wherein
the first semiconductor package includes a first substrate,
the first semiconductor chip is mounted on the first substrate,
the second semiconductor package includes a second substrate, and
the second semiconductor chip is mounted on the second substrate.

14. The semiconductor device of claim 13, wherein:
a width of the first semiconductor package is greater than a width of the second semiconductor package, and
the molding pattern extends from the first mold part to cover at least a portion of the second substrate.

15. The semiconductor device of claim 13, wherein:
the first mold part has an exposure mold underfill (e-MUF) structure exposing a top surface of the first semiconductor chip, and
the molding pattern covers the top surface of the first semiconductor chip.

16. The semiconductor device of claim 13, wherein the first mold part covers a top surface of the first semiconductor chip.

17. The semiconductor device of claim 13, wherein one of the first semiconductor chip and the second semiconductor chip includes a through-silicon-via (TSV) penetrating the one of the first semiconductor chip and the second semiconductor chip.

18. The semiconductor device of claim 13, wherein:
the connecting pattern is in a hole in the first mold part, and
the molding pattern extends to fill the hole including the connecting pattern disposed therein.

19. The semiconductor device of claim 12 wherein an outer sidewall of the molding pattern is substantially coplanar with the sidewall of the one of the at least two stacked semiconductor packages.

20. The semiconductor device of claim 12 wherein the molding pattern includes an underfill material.

* * * * *